(12) United States Patent
Chiu et al.

(10) Patent No.: US 11,823,891 B2
(45) Date of Patent: Nov. 21, 2023

(54) BACKSIDE METALLIZED COMPOUND SEMICONDUCTOR DEVICE AND METHOD FOR MANUFACTURING THE SAME

(71) Applicant: XIAMEN SANAN INTEGRATED CIRCUIT CO., LTD., Xiamen (CN)

(72) Inventors: Tsung-Te Chiu, Xiamen (CN);
Kechuang Lin, Xiamen (CN);
Houng-Chi Wei, Xiamen (CN);
Chia-Chu Kuo, Xiamen (CN);
Bing-Han Chuang, Xiamen (CN)

(73) Assignee: XIAMEN SANAN INTEGRATED CIRCUIT CO., LTD., Xiamen (CN)

( * ) Notice: Subject to any disclaimer, the term of this patent is extended or adjusted under 35 U.S.C. 154(b) by 3 days.

(21) Appl. No.: 17/082,314

(22) Filed: Oct. 28, 2020

(65) Prior Publication Data
US 2021/0134584 A1 May 6, 2021

(30) Foreign Application Priority Data
Oct. 31, 2019 (CN) .......................... 201911052408.2

(51) Int. Cl.
*H01L 21/02* (2006.01)
*C23C 14/16* (2006.01)

(52) U.S. Cl.
CPC ........ *H01L 21/02016* (2013.01); *C23C 14/16* (2013.01); *H01L 21/0254* (2013.01); *H01L 21/02581* (2013.01); *H01L 21/02554* (2013.01)

(58) Field of Classification Search
None
See application file for complete search history.

(56) References Cited

U.S. PATENT DOCUMENTS

| | | | | |
|---|---|---|---|---|
| 2010/0078819 A1* | 4/2010 | Shin | ................. | H01L 23/53238 438/653 |
| 2013/0249095 A1* | 9/2013 | Shen | ................... | H01L 21/6836 257/751 |
| 2013/0277845 A1* | 10/2013 | Chen | ..................... | H01L 23/481 438/650 |
| 2013/0299985 A1* | 11/2013 | Shen | ................... | H01L 21/6835 257/E21.159 |
| 2019/0096755 A1* | 3/2019 | Hua | ....................... | H01L 24/05 |
| 2020/0152445 A1* | 5/2020 | Chiu | ..................... | H01L 24/94 |

FOREIGN PATENT DOCUMENTS

CN 107579032 A * 1/2018 ....... H01L 21/02013

* cited by examiner

*Primary Examiner* — Elizabeth Collister
(74) *Attorney, Agent, or Firm* — Muncy, Geissler, Olds & Lowe

(57) ABSTRACT

A backside metallized compound semiconductor device includes a compound semiconductor wafer and a metal layered structure. The compound semiconductor wafer includes a substrate having opposite front and back surfaces, and a ground pad structure formed on the front surface. The substrate is formed with a via extending from the back surface to the front surface to expose a side wall of the substrate and a portion of the ground pad structure. The metal layered structure is disposed on the back surface, and covers the side wall and the portion of the ground pad structure. The metal layered structure includes an adhesion layer, a seed layer, a gold layer, and an electroplated copper layer that are formed on the back surface in such order. The method for manufacturing the backside metallized compound semiconductor device is also disclosed.

17 Claims, 6 Drawing Sheets

S110 — Providing a compound semiconductor wafer which includes a substrate and at least one ground pad structure formed on the substrate, and then forming at least one via that extends through the substrate to expose a portion of the ground pad structure and a side wall of the substrate

S120 — Forming an adhesion layer on the substrate opposite to the ground pad structure, the adhesion layer covering the side wall of the substrate and the exposed portion of the ground pad structure

S130 — Forming a seed layer on the adhesion layer opposite to the compound semiconductor wafer

S140 — Forming an aurum layer on the seed layer opposite to the adhesion layer

S150 — Forming an electroplating copper layer on the aurum layer opposite to the seed layer, the copper layer having a thickness ranging from 0.2 μm to 5.0 μm

FIG.3

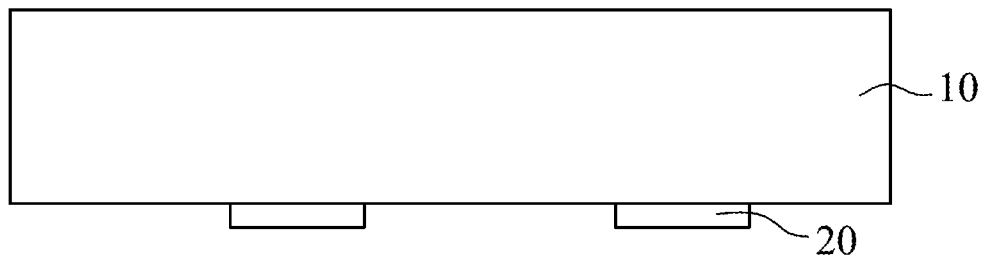
FIG.4
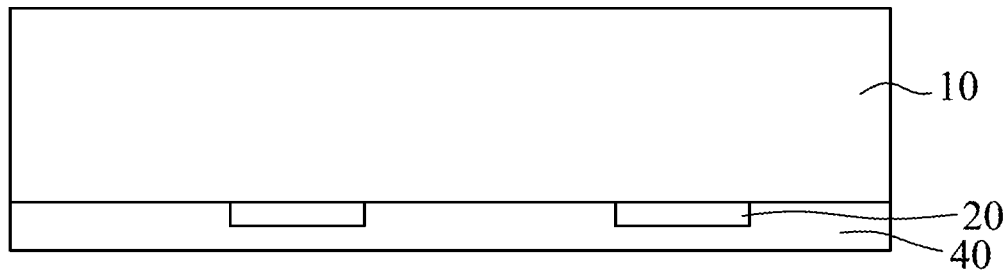
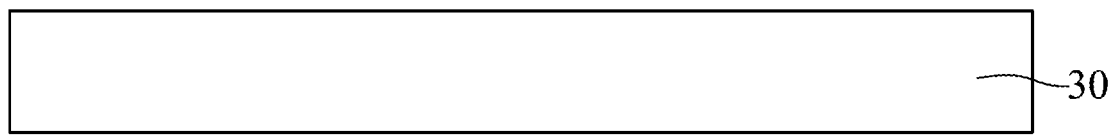
FIG.5
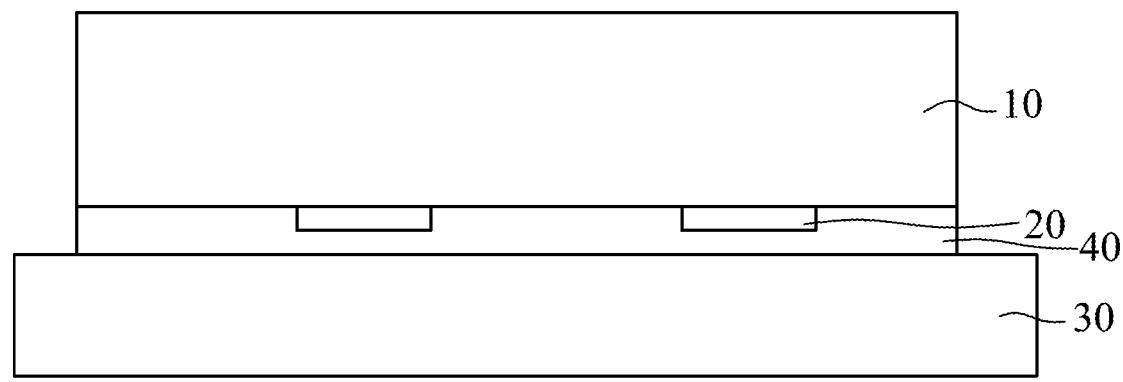
FIG.6

BACKSIDE METALLIZED COMPOUND SEMICONDUCTOR DEVICE AND METHOD FOR MANUFACTURING THE SAME

CROSS-REFERENCE TO RELATED APPLICATION

This application claims priority of Chinese Invention Patent Application No. 201911052408.2, filed on Oct. 31, 2019.

FIELD

The present disclosure relates to a compound semiconductor device, and more particularly to a backside metallized compound semiconductor device and a method for manufacturing the same.

BACKGROUND

A conventional compound semiconductor device generally includes a compound semiconductor wafer and a backside metallized layer which is formed on a back surface thereof and which is made of a gold or copper material, such that the conventional compound semiconductor device is conferred with a good heat dissipation effect. Since the cost of the gold material is relatively high, the backside metallized layer is mostly formed by deposition of the copper material using an electroplating process. However, the backside metallized layer made of the copper material has a relatively greater thickness (i.e., approximately 6 µm), causing the peripheral portion of the compound semiconductor wafer to be easily warped during the electroplating process, and thereby incurring a reduced yield in a subsequent cutting process.

SUMMARY

Therefore, an object of the present disclosure is to provide a compound semiconductor device that can alleviate at least one of the drawbacks of the prior art.

The compound semiconductor device includes a compound semiconductor wafer and a metal layered structure. The compound semiconductor wafer includes a substrate having opposite front and back surfaces, and a ground pad structure formed on the front surface of the substrate. The substrate is formed with a via that extends from the back surface to the front surface to expose a side wall of the substrate and a portion of the ground pad structure. The metal layered structure is disposed on the back surface of the substrate, and covers the side wall of the substrate and the portion of the ground pad structure. The metal layered structure includes an adhesion layer, a seed layer, a gold layer, and an electroplated copper layer. The adhesion layer is formed on the back surface of the substrate opposite to the ground pad structure. The seed layer is formed on the adhesion layer opposite to the substrate. The gold layer is formed on the seed layer opposite to the adhesion layer. The electroplated copper layer is formed on the gold layer opposite to the seed layer, and has a thickness ranging from 0.2 µm to 5.0 µm.

Another object of the present disclosure is to provide a method for manufacturing at least one backside metallized compound semiconductor device that can alleviate at least one of the drawbacks of the prior art.

The method includes the steps of:

(A) providing a compound semiconductor wafer which includes a substrate having opposite front and back surfaces, and at least one ground pad structure formed on the front surface of the substrate;

(B) forming at least one via that extends through the substrate to expose a portion of the ground pad structure and a side wall of the substrate;

(C) forming an adhesion layer on the back surface of the substrate opposite to the ground pad structure, the adhesion layer covering the side wall of the substrate and the portion of the ground pad structure;

(D) forming a seed layer on the adhesion layer opposite to the substrate;

(E) forming a gold layer on the seed layer opposite to the adhesion layer; and (F) forming an electroplated copper layer on the gold layer opposite to the seed layer, the copper layer having a thickness ranging from 0.2 µm to 5.0 µm.

BRIEF DESCRIPTION OF THE DRAWINGS

Other features and advantages of the present disclosure will become apparent in the following detailed description of the embodiments with reference to the accompanying drawings, of which:

FIG. 3 is a flow chart illustrating a method for manufacturing the embodiment of the backside metallized compound semiconductor device according to the present disclosure; and FIGS. 4 to 12 are schematic views respectively illustrating the consecutive steps of the method shown in FIG. 3.

DETAILED DESCRIPTION

Figure 1:
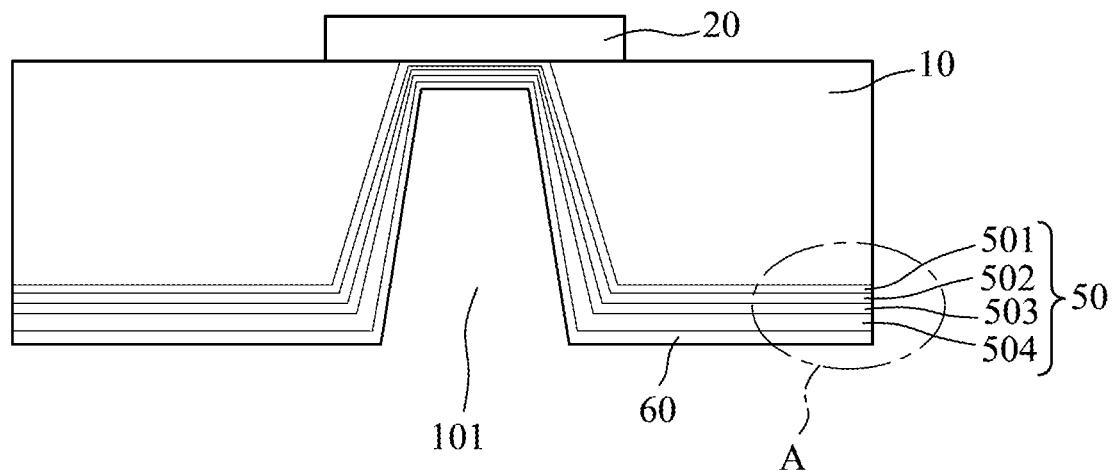
FIG. 1 is a schematic view illustrating an embodiment of a backside metallized compound semiconductor device according to the present disclosure.

Before the present disclosure is described in greater detail, it should be noted that where considered appropriate, reference numerals or terminal portions of reference numerals have been repeated among the figures to indicate corresponding or analogous elements, which may optionally have similar characteristics.

Figure 2:
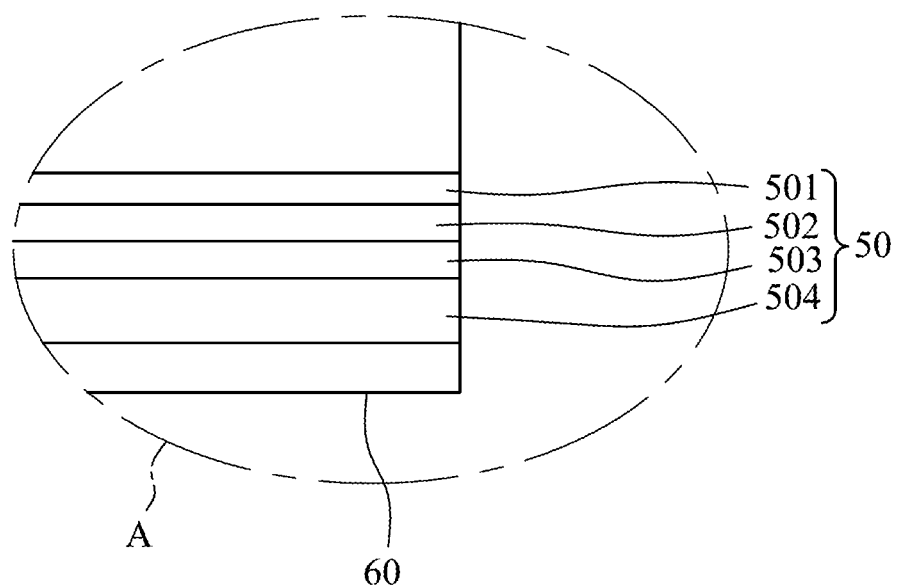
FIG. 2 is an enlarged schematic view of part A shown in FIG. 1.

Referring to FIGS. 1 and 2, an embodiment of a backside metalized compound semiconductor device of the present disclosure includes a compound semiconductor wafer and a metal layered structure 50.

The compound semiconductor wafer includes a substrate 10 that has opposite front and back surfaces, and a ground pad structure 20 formed on the front surface of the substrate 10. The substrate may have a thickness ranging from 50 µm to 200 µm, and may be made of a group III-V semiconductor material, such as indium arsenide (InAs), gallium nitride (GaN), indium phosphide (InP), gallium arsenide (GaAs), etc. The substrate 10 is formed with a via 101 that extends from the back surface to the front surface to expose a side wall of the substrate and a portion of the ground pad structure 20.

The metal layered structure 50 is disposed on the back surface of the substrate 10, and covers the side wall of the substrate 10 and the exposed portion of the ground pad structure 20. The metal layered structure 50 includes an adhesion layer 501, a seed layer 502, a gold layer 503, and an electroplated copper layer 504.

The adhesion layer 501 is formed on the back surface of the substrate 10 opposite to the ground pad structure 20. The adhesion layer 501 may contain a nickel vanadium material and a metallic material that is selected from the group consisting of tantalum nitride, titanium nitride, palladium, and titanium tungsten. Based on a total weight of the nickel vanadium material, nickel may be present in an amount ranging from 90 wt % to 97 wt %, and vanadium may be present in an amount ranging from 3 wt % to 10 wt %. The nickel vanadium material may form a sublayer having a thickness that ranges from 0.03 μm to 0.2 μm. The metallic material may form another sublayer having a thickness that ranges from 0.02 μm to 0.1 μm.

The seed layer 502 is formed on the adhesion layer 501 opposite to the substrate 10. The seed layer 502 may be made of gold. The seed layer 502 may have a thickness ranging from 0.05 μm to 0.5 μm.

The gold layer 503 is formed on the seed layer 502 opposite to the adhesion layer 501. The gold layer 503 may have a thickness ranging from 0.2 μm to 5.0 μm.

The electroplated copper layer 504 is formed on the gold layer 503 opposite to the seed layer 502, and has a thickness ranging from 0.2 μm to 5.0 μm.

The backside metalized compound semiconductor device of the present disclosure may further include an anti-oxidation layer 60 that is formed on the electroplated copper layer 504 opposite to the gold layer 503. The anti-oxidation layer 60 may contain a gold material, a nickel vanadium material and a metallic material that is selected from the group consisting of tantalum nitride, titanium nitride, palladium, and titanium tungsten. In the anti-oxidation layer 60, the nickel vanadium material may form a first sublayer having a thickness that ranges from 0.03 μm to 0.2 μm, the metallic material may form a second sublayer having a thickness that ranges from 0.02 μm to 0.1 μm, and the gold material may form a third sublayer (i.e., outermost sublayer) having a thickness that ranges from 0.05 μm to 0.5 μm.

Referring to FIG. 3, a method for manufacturing the embodiment of the backside metalized compound semiconductor device of the present disclosure includes the following consecutive steps S110 to S150.

Figure 8:
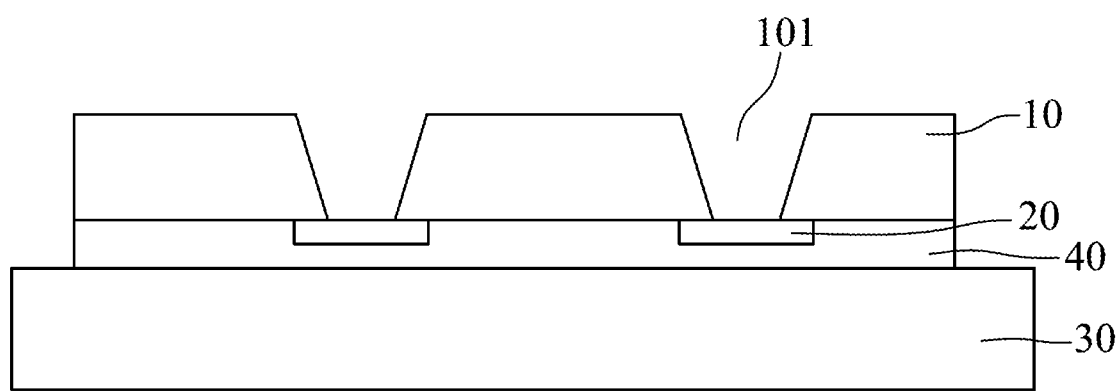

In step S110, the compound semiconductor wafer which includes the substrate 10 having the opposite front and back surfaces, as well as at least one ground pad structure 20 formed on the front surface of the substrate 10, is provided (see FIG. 4), and then at least one via 101 that extends through the substrate 10 to expose the portion of the ground pad structure 20 and the side wall of the substrate 10 is formed (see FIG. 8). Specifically, in this embodiment, the compound semiconductor wafer has been subjected to a metallization process on the front surface of the substrate 10, and a plurality of the ground pad structures 20 arranged in an array are spacedly disposed on the front surface of the substrate 10 (see FIG. 4).

It should be noted that, during the manufacturing of the backside metalized compound semiconductor device, the substrate 10 might be damaged due to the brittleness of the group III-V semiconductor material, and thus, as illustrated in FIG. 5, the front surface of the substrate 10 may be optionally attached to a supporting structure 30. To securely attach the compound semiconductor wafer to the supporting structure 30, a bonding material 40 is first applied to the front surface of the substrate and the ground pad structures 20, followed by attaching the substrate 10 to the supporting structure 30 through the bonding material 40 (see FIG. 6). The supporting structure 30 may have a shape similar to that of the substrate 10, and a dimension that is greater than or equal to that of the substrate 10. The supporting structure 30 may be made from sapphire or glass. In this embodiment, the bonding material 40 is a rosin-containing liquid wax, but is not limited thereto. In use, the rosin-containing liquid wax is first heated to become soft, and then the heated liquid wax is easily applied to the substrate 10 for bonding to the supporting structure 30. After cooling for a predetermined time, the rosin-containing liquid wax is cured to firmly bond the substrate 10 to the supporting structure 30.

Figure 7:
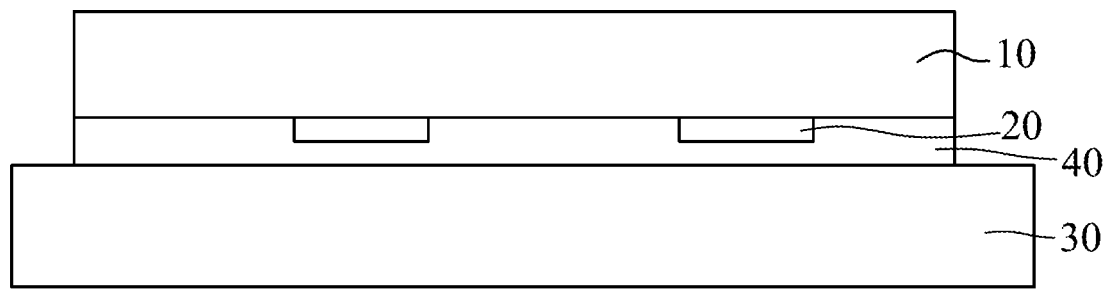

After the substrate 10 is attached to the supporting structure 30, the method may further include a step of grinding and wet etching the substrate 10 from the back surface thereof to reduce a thickness of the substrate 10. Specifically, the back surface of the substrate 10 is grinded using, e.g., a grinding wheel, such that the substrate 10 is made thinner, so as to meet the stringent size requirement for the compound semiconductor wafer (see FIG. 7). Thereafter, the substrate 10 may be subjected to wet etching such that a thickness ranging from 3 μm to 50 μm is etched away and the thickness of the substrate 10 is reduced to within a range from 50 μm to 200 μm, so as to eliminate the stress generated during the grinding step and to reduce roughness of the back surface of the substrate due to the grinding process.

Figure 9:
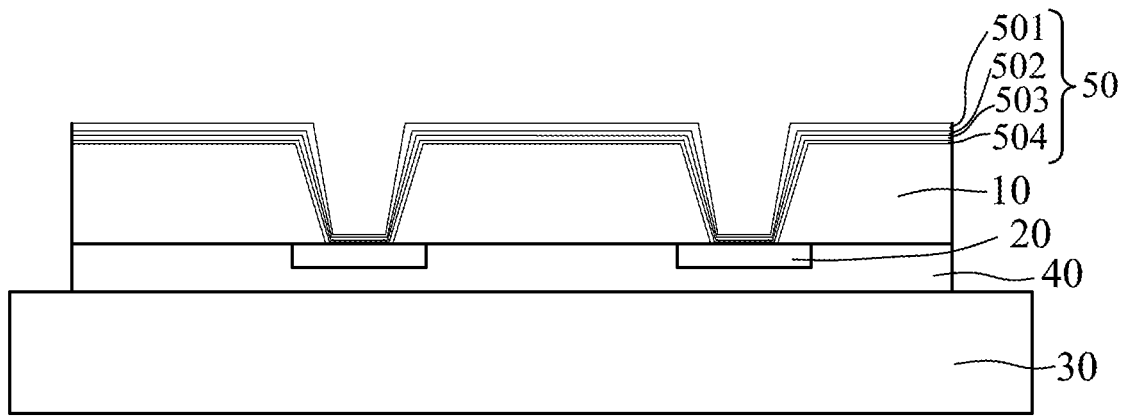

Afterwards, a plurality of the vias 101 that correspond in position and number to the ground pad structures 20 are formed on the substrate 10 by, e.g., wet etching or dry etching (see FIG. 8). For example, the back surface of the substrate 10 is covered with a photoresist, and then portions of the photoresist corresponding in position to the ground pad structures 20 are subjected to exposure and developing process, followed by etching the exposed portions of the substrate 10 not covered by the photoresist, so as to form the vias 101. Thereafter, the remaining portions of the photoresist may be removed using a chemical solvent, such as EKC™ Post-Etch Residue Remover (Manufacturer: DuPont de Nemours, Inc.), 1-methyl-2-pyrrolidone (NMP), etc. Steps S120 to S150 are illustrated in FIG. 9. In step S120, the adhesion layer 501 is formed on the back surface opposite to the ground pad structures 20, and over the side wall of the substrate 10 and the portion of the respective ground pad structure by, e.g., a sputtering process. In step S130, the seed layer 502 is formed on the adhesion layer 501 opposite to the compound semiconductor wafer by, e.g., a sputtering process. In step S140, the gold layer 503 is formed on the seed layer 502 opposite to the adhesion layer 501 by, e.g., an electroplating process. In step S150, the electroplated copper layer 504 is formed on the gold layer 503 opposite to the seed layer 502. In this embodiment, the adhesion layer 501, the seed layer 502, the gold layer 503, and the electroplated copper layer 504 cooperatively form the metal layered structure 50.

It is worth mentioning that the adhesion layer 501, which contains the nickel vanadium material and the metallic material (i.e., one of the tantalum nitride, titanium nitride, palladium and titanium tungsten), can increase adhesion to the ground pad structures 20 and the substrate 10, and also can adjust the stress generated in the sublayer formed by the metallic material and alleviate the stress subsequently generated in the electroplated copper layer 504 formed thereon.

In addition, since the rate of copper diffusion into the substrate 10 (e.g., a GaAs substrate) is greater than that of gold diffusion into the substrate 10, copper from the electroplated copper layer 504 is prone to diffuse into the GaAs substrate and creates deep energy levels in GaAs band gap region which trap charges, thereby causing malfunction of the resultant compound semiconductor device. Therefore, the gold layer 503 having a relatively greater thickness (e.g., 0.2 µm to 5.0 µm) can block the diffusion of copper from the electroplated copper layer 504 into the GaAs substrate 10.

Moreover, by controlling the thickness of the electroplated copper layer 504 (i.e., maintaining such thickness as 0.2 µm to 5.0 µm), even when the substrate 10 is thin, the stress generated during formation of the electroplated copper layer 504 can be reduced so as to prevent the warpage of the peripheral region of the substrate 10.

It should be noted that, during the formation of the electroplated copper layer 504, crystal defects of copper might be generated, which might cause internal stress and then adversely affect the stability of the resultant backside metalized compound semiconductor device. Therefore, the electroplated copper layer 504 may be further subjected to a baking process under heating to eliminate the internal stress. The baking process may be conducted at a temperature ranging from 80° C. to 200° C. for a time period that ranges from 30 minutes to 120 minutes.

By formation of the vias 101 each exposing the portion of the respective one of the ground pad structures 20 and the side wall of the substrate 10, the metal layered structure 50 can be electrically and thermally in contact with the ground pad structures 20 that are formed on the front surface of the substrate 10. Therefore, after the backside metalized compound semiconductor device of the present disclosure is subjected to a packaging process, internal thermal energy can be effectively conducted to a heat sink of a package structure, thereby effectively reducing the thermal resistance and surface temperature of the backside metalized compound semiconductor device so as to stabilize the performance thereof.

Figure 10:
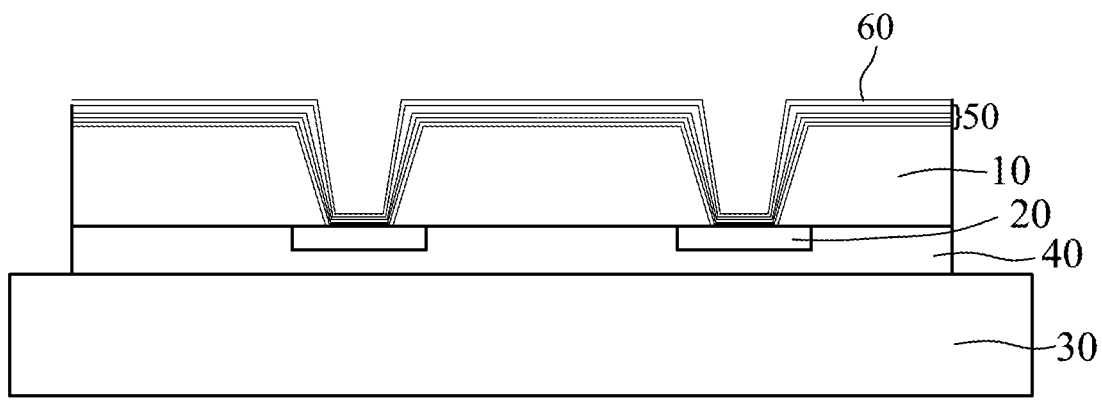

Referring to FIG. 10, taking into account that the cooper of the electroplated copper layer 504 might be easily oxidized which adversely affects the performance of the backside metalized compound semiconductor device of the present disclosure, in this embodiment, the method may further include forming the anti-oxidation layer 60 on the electroplated copper layer 504 opposite to the gold layer 503 through, e.g., a sputtering process.

A conventional backside cutting process includes subjecting a backside metal structure formed with a backside metal structure to a photolithography process to form a plurality of spaced-apart trenches, and then cutting along the trenches by etching to obtain a plurality of backside metallized compound semiconductor devices for facilitating a subsequent packaging process. The abovementioned cutting process is complicated, and thus, would inevitably increase the time, cost and labor for manufacturing compound semiconductor devices.

Therefore, in order to avoid the abovementioned shortcomings of the conventional backside cutting process, the method of the present disclosure may further include, after step S150, a step of subjecting the compound semiconductor wafer and the metal layered structure 50 to a dicing process with a laser beam, so as to obtain a plurality of the compound semiconductor devices that are separated from one another, as shown in FIG. 1.

Figure 11:
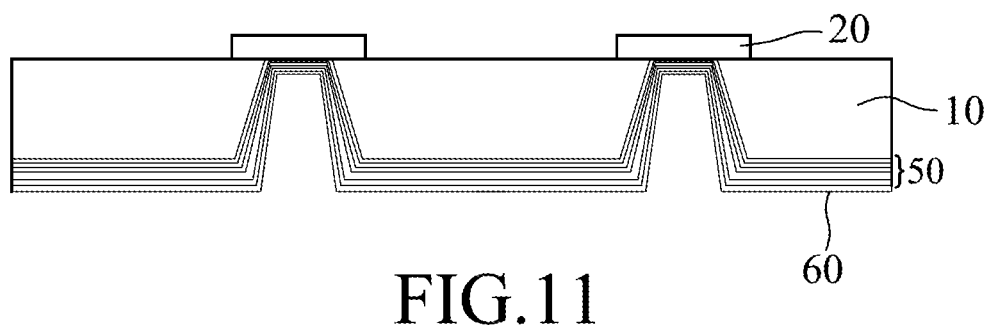

Specifically, prior to the dicing process, the supporting structure 30 is removed from the compound semiconductor wafer using, e.g., a thermal separation technique or a solvent (see FIG. 11). For example, the bonding material 40 is first softened under heating to separate the supporting structure from the compound semiconductor wafer and the metal layered structure 50, and then a solvent is used for cleaning the front surface of the substrate and the ground pad structures 20 to remove the remaining bonding material 40.

Figure 12:
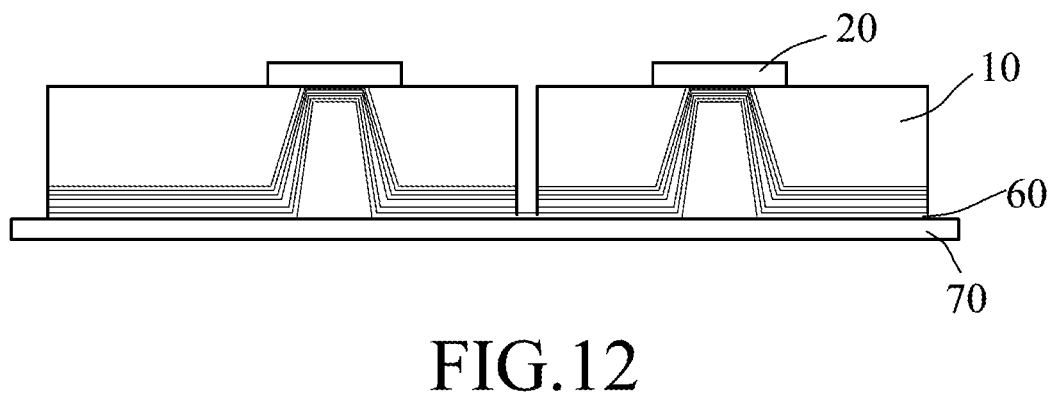

Thereafter, a dicing tape 70 is adhered to a bottom surface of the metal layered structure 50 with the ground pad structure 20 facing up (see FIG. 12).

During the dicing process, the laser beam is first irradiated in a direction substantially perpendicular to the front surface of the substrate 10. The dicing process may optionally include a first cutting step of cutting the substrate 10 from a region of the front surface between two adjacent ones of the ground pad structures 20 toward the back surface of the substrate 10 to form a plurality of spaced-apart trenches, and a second cutting step of cutting the substrate 10 and the metal layered structure 50 along the trenches so as to obtain the separated backside metallized compound semiconductor devices. In the first cutting step, the laser beam is emitted along a first direction so as to form a first group of trenches that are arranged parallel to each other and extend in the first direction, and along a second direction that is perpendicular to the first direction so as to form a second group of trenches that are arranged parallel to each other and extend in the second direction. Each of the trenches may have a depth which ranges from 40% to 60% of a thickness of the substrate 10. The dicing process may be performed at a processing speed ranging from 100 mm/s to 400 mm/s, and the laser beam may have a power ranging from 2.0 W to 6.5 W.

Alternatively, the dicing process may completely cut the substrate 10 and the metal layered structure 50 in a single cutting step so as to separate the compound semiconductor devices from one another.

Since the dicing tape 70 is stretchable and has adhesiveness characteristic, the thus obtained separated compound semiconductor devices, while still adhered to the dicing tape 70, can be further separated from one another by stretching the dicing tape 70.

The inside of the compound semiconductor devices might be prone to generate stress due to the dicing process. Therefore, after the dicing process, the metal layered structure 50 of each of the compound semiconductor devices may be immersed in an aqueous solution, such as an ammonia solution, a hydrogen peroxide solution, etc., for a time period ranging from 20 seconds to 150 seconds, so as to eliminate the stress.

After immersion in the aqueous solution, the copper from the electroplated copper layer 504 of the metal layered structure 50 might precipitate and adhere to the chip surface of the compound semiconductor device. Therefore, the aqueous solution may include hydrochloric acid and water in a ratio which ranges from 1:1 to 1:10, and the immersion may be performed for a time period ranging from 10 seconds to 60 seconds.

Following immersion in the aqueous solution, the thus obtained compound semiconductor devices are subjected to cleaning, drying, and subsequent packaging.

In summary, by forming the metal layered structure 50 which includes the adhesion layer 501, the seed layer 502, the gold layer 503 and the electroplated copper layer 504 on the back surface of the substrate 10, and by extending the metal layered structure 50 into the via 101 to contact with the ground pad structure 20 of the compound semiconductor wafer, the thus manufactured backside metalized compound semiconductor device of the present disclosure achieves improved heat dissipation due to the high thermal conductivity of copper. In addition, since the electroplated copper layer 504 has a thickness ranging from 0.2 µm to 5.0 µm, the stress thus generated can be reduced, and the warpage of the peripheral region of the substrate 10 can also be prevented.

In the description above, for the purposes of explanation, numerous specific details have been set forth in order to provide a thorough understanding of the embodiments. It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects, and that one or more features or specific details from one embodiment may be practiced together with one or more features or specific details from another embodiment, where appropriate, in the practice of the disclosure.

While the present disclosure has been described in connection with what is considered the exemplary embodiments, it is understood that this disclosure is not limited to the disclosed embodiments but is intended to cover various arrangements included within the spirit and scope of the broadest interpretation so as to encompass all such modifications and equivalent arrangements.

What is claimed is:

1. A backside metallized compound semiconductor device, comprising:
    a compound semiconductor wafer including a substrate having opposite front and back surfaces, and a ground pad structure formed on said front surface of said substrate, said substrate being formed with an via that extends from said back surface to said front surface to expose a side wall of said substrate and a portion of said ground pad structure; and
    a metal layered structure disposed on said back surface of said substrate, and covering said side wall of said substrate and said portion of said ground pad structure, said metal layered structure including
    an adhesion layer formed on said back surface of said substrate opposite to said ground pad structure,
    a seed layer formed on said adhesion layer opposite to said substrate,
    a gold layer formed on said seed layer opposite to said adhesion layer, and
    an electroplated copper layer formed on said gold layer opposite to said seed layer, and having a thickness ranging from 0.2 µm to 5.0 µm,
    wherein said gold layer has a thickness that ranges from 0.2 µm to 5.0 µm,
    wherein said adhesion layer contains a nickel vanadium material and a metallic material that is selected from the group consisting of tantalum nitride, titanium nitride, palladium, and titanium tungsten, and
    wherein said metallic material forms a sublayer having a thickness that ranges from 0.02 µm to 0.1 µm.

2. The backside metallized compound semiconductor device as claimed in claim 1, wherein said nickel vanadium material forms a sublayer having a thickness that ranges from 0.03 µm to 0.2 µm.

3. The backside metallized compound semiconductor device as claimed in claim 1, wherein said nickel vanadium material contains nickel in an amount that ranges from 90 wt % to 97 wt % and vanadium in an amount that ranges from 3 wt % to 10 wt % based on a total weight of said nickel vanadium material.

4. The backside metallized compound semiconductor device as claimed in claim 1, wherein said substrate has a thickness that ranges from 50 µm to 200 µm.

5. The backside metallized compound semiconductor device as claimed in claim 1, further comprising an anti-oxidation layer formed on said electroplated copper layer opposite to said gold layer.

6. The backside metallized compound semiconductor device as claimed in claim 1, wherein said seed layer is made of gold.

7. The backside metallized compound semiconductor device as claimed in claim 1, wherein said seed layer has a thickness that ranges from 0.05 µm to 0.5 µm.

8. A method for manufacturing at least one backside metallized compound semiconductor device as claimed in claim 1, comprising the steps of:
    (A) providing a compound semiconductor wafer which includes a substrate having opposite front and back surfaces, and at least one ground pad structure formed on the front surface of the substrate;
    (B) forming at least one via that extends through the substrate to expose a portion of the ground pad structure and a side wall of the substrate;
    (C) forming an adhesion layer on the back surface of the substrate opposite to the ground pad structure, the adhesion layer covering the side wall of the substrate and the portion of the ground pad structure;
    (D) forming a seed layer on the adhesion layer opposite to the substrate;
    (E) forming a gold layer on the seed layer opposite to the adhesion layer; and
    (F) forming an electroplated copper layer on the gold layer opposite to the seed layer, the electroplated copper layer having a thickness ranging from 0.2 µm to 5.0 µm, wherein said gold layer has a thickness that ranges from 0.2 µm to 5.0 µm.

9. The method as claimed in claim 8, further comprising a step of grinding and wet etching the substrate from the back surface to reduce a thickness of the substrate for the same to range from 50 µm to 200 µm.

10. The method as claimed in claim 8, wherein:
    the adhesion layer, the seed layer, the gold layer, and the electroplated copper layer cooperatively form a metal layered structure;
    in step (A), the compound semiconductor wafer includes a plurality of the ground pad structures that are spaced apart from one another;
    in step (B), the substrate is formed with a plurality of the vias that correspond in position and number to the ground pad structures; and
    the method further comprises, after step (F), a step (G) of subjecting the compound semiconductor wafer and the metal layered structure to a dicing process with a laser beam, so as to obtain a plurality of backside metallized compound semiconductor devices that are separated from one another.

11. The method as claimed in claim 10, wherein in step (G), the dicing process includes:
    a first cutting step of cutting the substrate from a region of the front surface between two adjacent ones of the ground pad structures toward the back surface to form a plurality of spaced-apart trenches, each having a depth which ranges from 40% to 60% of a thickness of the substrate; and a second cutting step of cutting the substrate and the metal layered structure along the trenches so as to obtain the separated backside metallized compound semiconductor devices.

12. The method as claimed in claim 11, wherein in step (G), the dicing process is performed at a processing speed ranging from 100 mm/s to 400 mm/s, and the laser beam has a power ranging from 2.0 W to 6.5 W.

13. The method as claimed in claim 8, wherein the adhesion layer is formed by a sputtering process, the adhesion layer containing a nickel vanadium material and a metallic material that is selected from the group consisting of tantalum nitride, titanium nitride, palladium, and titanium tungsten.

14. The method as claimed in claim 13, wherein the nickel vanadium material forms a sublayer having a thickness that ranges from 0.03 μm to 0.2 μm, the metallic material forming a sublayer having a thickness that ranges from 0.02 μm to 0.1 μm.

15. The method as claimed in claim 8, further comprising forming an anti-oxidation layer on the electroplated copper layer opposite to the gold layer.

16. The method as claimed in claim 15, wherein the anti-oxidation layer is formed by a sputtering process, the anti-oxidation layer containing a gold material, a nickel vanadium material and a metallic material that is selected from the group consisting of tantalum nitride, titanium nitride, palladium, and titanium tungsten.

17. The method as claimed in claim 16, wherein in the anti-oxidation layer, the nickel vanadium material forms a first sublayer having a thickness that ranges from 0.03 μm to 0.2 μm, the metallic material forms a second sublayer having a thickness that ranges from 0.02 μm to 0.1 μm, and the gold material forms a third sublayer having a thickness that ranges from 0.05 μm to 0.5 μm.

* * * * *